United States Patent

Sugawara et al.

(10) Patent No.: US 7,517,751 B2
(45) Date of Patent: Apr. 14, 2009

(54) SUBSTRATE TREATING METHOD

(75) Inventors: Takuya Sugawara, Nirasaki (JP); Seiji Matsuyama, Amagasaki (JP); Masaru Sasaki, Amagasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/076,282

(22) Filed: Mar. 10, 2005

(65) Prior Publication Data

US 2005/0164523 A1 Jul. 28, 2005

Related U.S. Application Data

(63) Continuation of application No. 10/499,347, filed as application No. PCT/JP02/13134 on Dec. 16, 2002, now abandoned.

(30) Foreign Application Priority Data

Dec. 18, 2001 (JP) .............................. 2001-385108

(51) Int. Cl.
*H01L 21/8242* (2006.01)
(52) U.S. Cl. .................... 438/240; 438/287; 438/775; 438/777
(58) Field of Classification Search ................ 438/287, 438/3, 240, 770–778, 791–792
See application file for complete search history.

(56) References Cited

U.S. PATENT DOCUMENTS

| | | | | | |
|---|---|---|---|---|---|
| 5,685,949 | A | * | 11/1997 | Yashima | 438/694 |
| 5,885,870 | A | * | 3/1999 | Maiti et al. | 438/261 |
| 6,821,566 | B2 | | 11/2004 | Nakamura et al. | |
| 2002/0009898 | A1 | * | 1/2002 | Tanabe et al. | 438/770 |
| 2002/0040847 | A1 | * | 4/2002 | Ohmi et al. | 204/192.22 |
| 2002/0073925 | A1 | * | 6/2002 | Noble et al. | 118/723 ME |
| 2002/0142588 | A1 | * | 10/2002 | Basceri et al. | 438/652 |

FOREIGN PATENT DOCUMENTS

| | | |
|---|---|---|
| JP | 9-148325 | 6/1997 |
| JP | 10-27795 | 1/1998 |
| JP | 2000-332009 | 11/2000 |
| JP | 2001-85427 | 3/2001 |
| JP | 2001-148381 | 5/2001 |
| WO | WO 02/09166 | 1/2002 |
| WO | WO 02/054473 | 7/2002 |

* cited by examiner

*Primary Examiner*—H. Jey Tsai
(74) *Attorney, Agent, or Firm*—Crowell & Moring LLP (57) ABSTRACT

A substrate processing method includes the step of forming an oxide film by oxidizing a silicon substrate surface and the step of nitriding the oxide film to form an oxynitride film, wherein there is provided a step of purging oxygen after the oxidizing step but before said nitriding step from an ambient in which said nitriding processing is conducted.

5 Claims, 6 Drawing Sheets

SUBSTRATE TREATING METHOD

BACKGROUND OF THE INVENTION

The present invention generally relates to substrate processing technology and more particularly to a substrate processing method of forming a high-K dielectric-film on a substrate.

With the progress in the technology of device miniaturization, production of ultra-fine semiconductor devices having a MOS transistor with a gate length of less than 0.1 μm is becoming possible.

To improve the operational speed of such ultra-fine semiconductor devices further by way of reduction of gate length of the MOS transistor, there is a need of reducing the thickness of the gate insulation film according to scaling law. For example, in the case of using a conventional silicon oxide film as the gate insulation film, it is necessary to reduce the thickness of the gate insulation film to 1.7 nm or less. However, when the thickness of the oxide film is decreased like this, there occurs an increase of gate leakage current through the oxide film by tunneling effect, and there is caused deterioration of device characteristics such as increase of electric power consumption, and the like.

Thus, it has been studied conventionally to use a high-K dielectric film such as the film of $Ta_2O_5$, $ZrO_2$, $HfO_2$ or $Al_2O_3$, and the like, for the gate insulation film, in place of the conventional silicon oxide film. However, such a high-K dielectric film has the properties very much different from those of the silicon oxide film used conventionally in the semiconductor technology, and there remain numerous problems to be solved in order to establish the technology of using such a high-K dielectric film as the gate insulation film.

Contrary to this, a silicon nitride film is the material that has been used in the conventional semiconductor process and has various advantageous features such as large specific dielectric constant of twice as large as that of a silicon oxide film. Further, a silicon nitride film has the capability of blocking diffusion of dopant elements in the gate electrode into the silicon substrate effectively. Thus, silicon nitride is thought as being a promising material for the gate insulation film of the next generation high-speed semiconductor devices.

Conventionally, a silicon nitride film has been formed by a plasma CVD process. However, such a CVD nitride film generally shows poor interface characteristics and the user thereof for a gate insulation film has been thought inappropriate. Because of this, there has been no attempt conventionally to use a nitride film for the gate insulation film.

On the other hand, there has been a proposal recently about the technology of converting the surface of a silicon oxide film to an oxynitride film by introducing a nitrogen gas or a mixture of a nitrogen gas and a hydrogen gas or a gas containing nitrogen such as $NH_3$ into microwave-excited rare gas plasma of Ar, Kr, He and the like, to form N radicals or NH radicals. (Katsuyuki Sekine, Yuji Sato, Masaki Hirayama and Tadahiro Ohmi, J. Vac. Sci. Technol. A17(5), September/October 1999, pp.3129-3133; Takuya Sugawara, Toshio Nakanishi, Masaru Sasaki, Shigenori Ozaki, Yoshihide Tada, Extended Abstracts of Solid State Devices and Materials, 2002, pp.714-715). The oxynitride film thus formed has interface characteristics comparable to or superior to that of a silicon thermal oxide film, and thus, the oxynitride film is thought as being a promising material for the gate insulation film of the next generation high-speed semiconductor devices. Further, there is proposed a plasma nitridation technology that directly converts the surface of a silicon substrate by a nitriding processing by using such microwave plasma.

Further, there is the technology of plasma oxidation that directly oxidizes a silicon substrate surface by introducing a gas containing oxygen into the foregoing rare gas plasma.

In the case of conducting a plasma nitridation processing subsequently to oxidizing processing in the same apparatus, on the other hand, there appears a problem in that oxidization occurs simultaneously to the nitridation due to the residual oxygen, which has been introduced into a processing apparatus previously for the oxidation processing or for other processing and remaining in the processing ambient, and there occurs an increase of thickness of the gate insulation film formed by such a nitridation processing. When such increase of the film thickness occurs, the desired improvement of operational speed of the semiconductor device according to the scaling low is not attained. This problem of increase of film thickness of the gate insulation film becomes particularly serious when the nitridation processing is conducted for long time in order to cause more diffusion of the introduced nitrogen atoms in the thickness direction of the film or in the case in which the thickness of the base oxide film is small. (Takuya Sugawara, et al., op. cit.; C. C. Chen, M. C. Yu, M. F. Wang, T. L. Lee, S. C. Chen, C. H. Yu and M. S. Liang, 2002 7th International Symposium on Plasma and Process Induced Damage, pp.41-44).

Further, even in the case the oxidation processing and the nitridation processing are conducted in different apparatuses, a similar problem of increase of film thickness of the gate insulation film by oxidation can be caused also when water is adsorbed to the substrate. In such a case, water is transported from the oxidation processing apparatus to the nitridation processing apparatus together with the substrate to be processed.

SUMMARY OF THE INVENTION

Accordingly, it is a general object of the present invention to provide a novel and useful substrate processing apparatus and processing method wherein the foregoing problems are eliminated.

Another and more specific object of the present invention is to provide a substrate processing method and a substrate processing apparatus capable, when conducting nitridation of an oxide film formed as a result of oxidation processing of a silicon substrate surface to form an oxynitride film, of suppressing the increase of film thickness of the oxynitride film thus formed by the nitridation processing.

Another object of the present invention is to provide a substrate processing method comprising the steps of:

forming an oxide film by an oxidation processing of a silicon substrate surface; and forming an oxynitride film by a nitriding processing of said oxide film, wherein there is provided an oxygen purging step of purging oxygen, after said step of oxidation processing but before said step of nitriding processing, from an ambient in which said nitriding processing is to be conducted.

According to the present invention, increase of film thickness, caused by the oxygen remaining in the ambient at the time of the nitridation processing of the oxide film formed on the silicon substrate surface, is suppressed, and it becomes possible to form an extremely thin oxynitride film suitable for the gate insulation film of a ultra high-speed semiconductor device.

DETAILED DESCRIPTION OF THE PREFERRED EMBODIMENTS

First Embodiment

Figure 1:
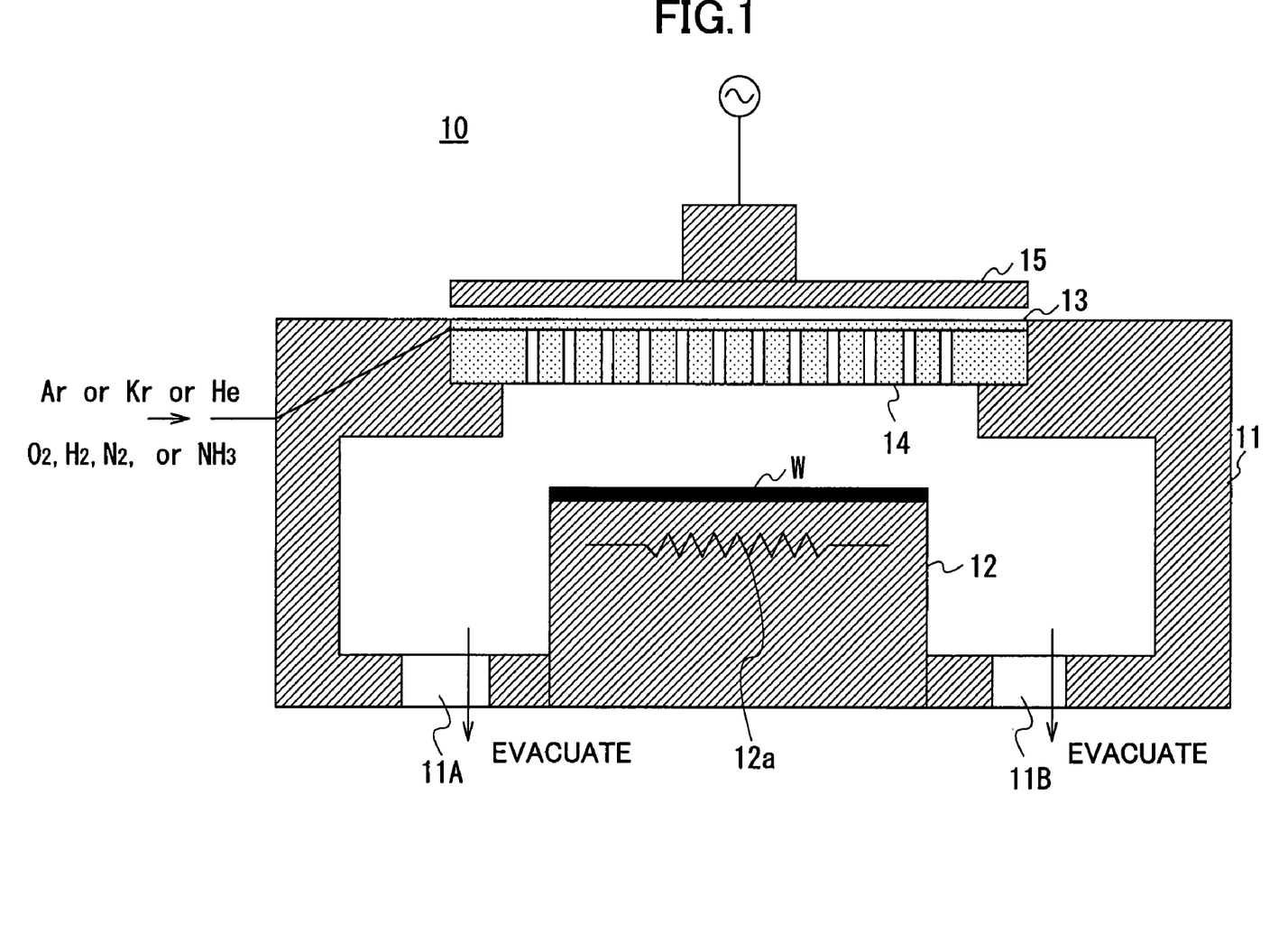
FIG. 1 is a diagram showing the construction of a substrate processing apparatus used in a first embodiment of the present invention.

FIG. 1 is a schematic diagram showing the construction of a substrate processing apparatus 10 used with the present invention.

Referring to FIG. 1, the substrate processing apparatus 10 has a processing vessel 11 accommodating therein a stage 12 that holds a substrate W to be processed thereon, and the processing vessel 11 is evacuated at an evacuation port 11A. The stage 12 includes a substrate temperature control mechanism 12a such as a heater.

On the processing vessel 11, there is formed an opening in correspondence to the substrate W to be processed on the stage 12, and the opening is closed by a cover plate 13 formed of a low loss ceramic material such as alumina, and the like. Below the cover plate 13, there is formed a shower plate 14 of a low loss ceramic such as alumina, and the like, wherein the shower plate 14 is formed with a gas inlet path, and a large number of nozzle openings are formed in the shower plate 14 in communication with the gas inlet path, such that the shower plate 14 faces the substrate W to be processed.

The cover plate 13 and the shower plate 14 form a microwave window, and there is formed a microwave antenna 15 such as a radial line slot antenna, a horn antenna, or the like, at the outer side of the above-mentioned cover plate 13.

In operation, the processing space inside the processing vessel 11 is set to a predetermined process pressure by evacuating the processing vessel 11 through the evacuation port 11A, and an oxidation gas or a nitridation gas is introduced into the processing vessel 11 from the shower plate 14 together with a rare gas of Ar, Kr and the like.

Further, a microwave of several GHz in frequency is fed from an upper part of the above-mentioned antenna 15, wherein the microwave thus fed propagates in the antenna in the radial direction and is emitted in the downward direction of the antenna. Thereby, the microwave passes through the cover plate 13 and is introduced into the vacuum vessel 11. Because the microwave is thus introduced through the antenna, there is formed high density plasma of low electron temperature with uniform plasma distribution. In the substrate processing apparatus of FIG. 1, the plasma has a characteristically low electron temperature, and damaging is avoided in the substrate W to be processed or in the inner wall of the processing vessel 11. Further, it should be noted that the radicals formed with the plasma are caused to flow along the surface of the substrate W rapidly in the radial direction and are evacuated promptly. Thereby, recombination of the radicals is suppressed, and it becomes possible to realize an extremely uniform and highly efficient substrate processing at the low process temperature of 600 °C. or less.

Figure 2:
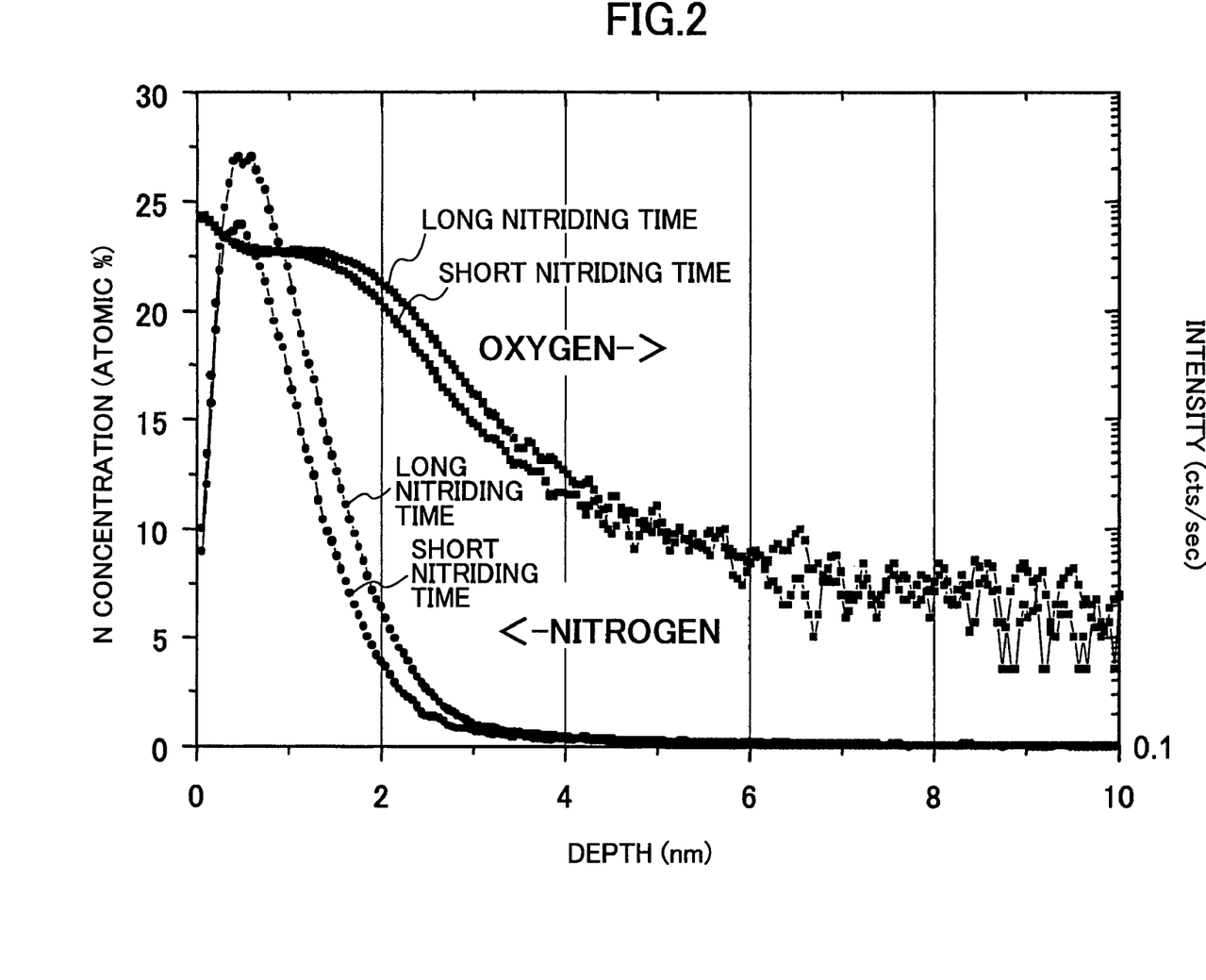
FIG. 2 is a diagram showing the distribution of oxygen atoms and nitrogen atoms in an oxynitride film formed by the substrate processing apparatus of FIG. 1 for the case the oxidation processing of the silicon substrate and the nitridation processing are conducted consecutively.

FIG. 2 shows the SIMS profile of oxygen atoms and nitrogen atoms in an oxynitride film formed by oxidizing a silicon substrate surface to form a plasma oxide film and then nitriding the plasma oxide film thus obtained by using the substrate processing apparatus 10 of FIG. 1. Here, it should be noted that the experiment of FIG. 2 has been made for the oxide film formed in the substrate processing apparatus 10 of FIG. 1 at the substrate temperature of 400° C. under the pressure of about $1.33 \times 10^1$ Pa while supplying an Ar gas and an oxygen gas to the processing vessel 11 with respective flow rates of 1000 SCCM and 20 SCCM and by supplying a microwave of 2.45 GHz with the electric power of 1500 W. Further, the nitriding processing has been conducted at the substrate temperature of 400° C. under the pressure of about $1.33 \times 10^1$ Pa while supplying an Ar gas and a nitrogen gas with respective flow rates of 1000 SCCM and 20 SCCM and by feeding the microwave with the power of 1500 W.

Referring to FIG. 2, it can be seen that there is formed a concentration region of nitrogen in the oxide film in the vicinity of the surfaces indicating that and there is caused a diffusion of nitrogen atoms to the interior of the oxide film from such a nitrogen concentration region. In the oxynitride film thus formed by diffusion of the nitrogen atoms into the oxide film, there occurs no formation of interface between the nitrogen concentration region and the oxide film, and thus, there occurs no formation of traps in the film.

FIG. 2 also shows the concentration distribution of the nitrogen atoms and the oxygen atoms for the case in which the nitridation time is changed. As can be seen from FIG. 2, there occurs an increase of oxygen concentration in the film when the nitridation time is increased, while this means that there is caused an increase of film thickness in the oxide film as a result of penetration of oxygen to the interior of the silicon substrate. It is believed that oxygen that has caused such an increase of the oxide film thickness originates from the oxygen molecules adhered to the interior wall of the processing vessel 11 or the gas supply line, or alternatively from the moisture adhered to the substrate surface.

Figure 3A:
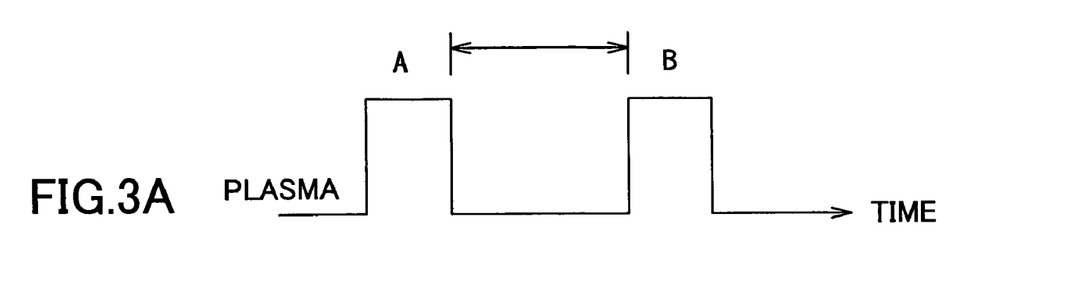
FIGS. 3A-3E are the diagrams showing the substrate processing method according to a first embodiment of the present invention.
Figure 3B:
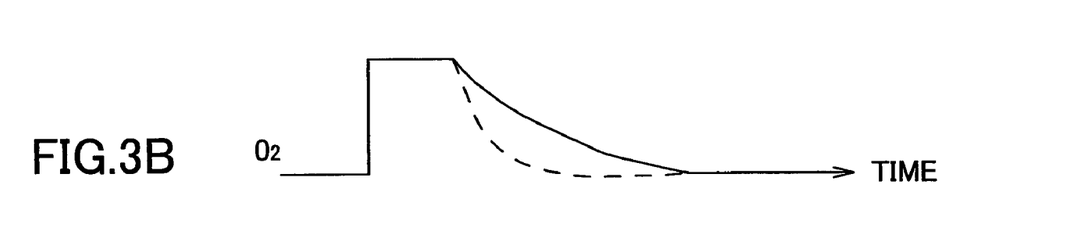
Figure 3C:
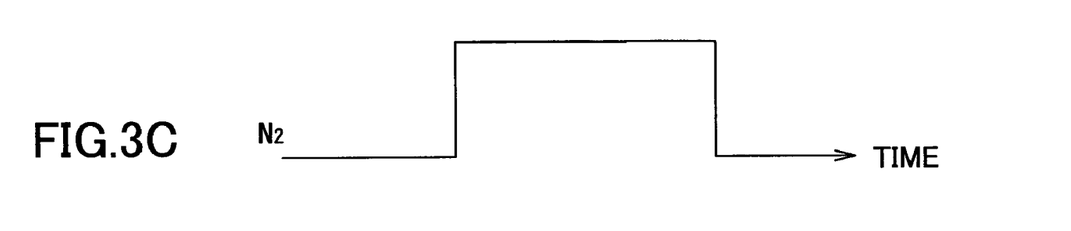

FIGS. 3A-3C show the mechanism of film thickness increase caused in such an oxide film at the time of the nitridation processing for the case in which the oxidation and nitridation has been conducted in the substrate processing apparatus 10 of FIG. 1. Further, the drawings show the substrate processing method according to a first embodiment of the present invention that suppresses the film thickness increase of such an oxide film. Here, it should be noted that FIG. 3A shows the plasma energization sequence in the processing vessel 11, FIG. 3B shows an oxygen concentration change in the processing vessel 11 and FIG. 3C shows the nitrogen concentration change in the same processing vessel 11 at the time of the oxidation processing and at the time of the nitridation processing.

Referring to FIG. 3A, Ar plasma A and B are excited in the processing vessel 11 respectively in the oxidation processing step and the nitridation processing step, wherein an oxygen gas is introduced into the processing vessel 11 at the time of the oxidation processing step as shown in FIGS. 3B while a nitrogen gas is introduced into the processing vessel 11 at the time of the nitridation processing step as shown in FIG. 3C. Further, upon completion the oxidation processing, the plasma A is turned off and the supply of the oxygen gas is shut down. Similarly, upon completion of the nitridation processing, the plasma B is turned off and the supply of the nitrogen gas is shut down.

Here, it should be noted that, at the time in which the oxidation processing has been shut down, the oxygen molecules adhered to the vessel wall of the processing vessel or the gas supply line are discharged gradually even after the supply of the oxygen gas has been shut down, and there is caused a tail in the oxygen concentration profile in the processing vessel 11 as show in FIG. 3B.

Thus, in the case the nitrogen gas is introduced into the processing vessel 11 and the plasma is turned on immediately after the supply of the oxygen gas is shut down, the oxygen remaining in the processing vessel 11 undergoes activation, and it is believed that the oxygen radicals formed as a result cause the oxidation of the silicon substrate concurrently to the nitridation of the oxide film.

In order to avoid this problem, the present embodiment delays the turn-on of the plasma B at the time of the nitridation processing by about 1-600 seconds after the turn-off of the plasma A conducted in response to the completion of the oxidation processing as shown in FIG. 3A and introduce the nitrogen gas to the processing vessel 11 together with an Ar gas immediately after the shutting down of the oxygen gas supply. As a result, the interior of processing vessel 11 is purged efficiently by the Ar gas and the nitrogen gas thus introduced until the plasma is tuned on again. By purging the interior of the processing vessel 11 by nitrogen gas, after the oxidation processing like this, oxygen inside the processing vessel 11 are purged rapidly as shown in FIG. 3B with a broken line, and it becomes possible to reduce the overall substrate processing time. In the foregoing purging process, it is possible to supply the Ar gas with the flow rate of 1000 SCCM similarly to the case of the oxidation processing or nitridation processing and supply the nitrogen gas with a flow rate of 20 SCCM.

The following Table 1 shows an example of representative recipe of the present embodiment.

TABLE 1

| Ar (SCCM) | O$_2$ (SCCM) | N$_2$ (SCCM) | Microwave power (W) | time (second) |
|---|---|---|---|---|
| 1000 | 20 | | 1500 | 40 |
| 1000 | | 20 | 0 | N$_2$ Purge |
| 1000 | | 20 | 1500 | 30 |

Figure 3D:
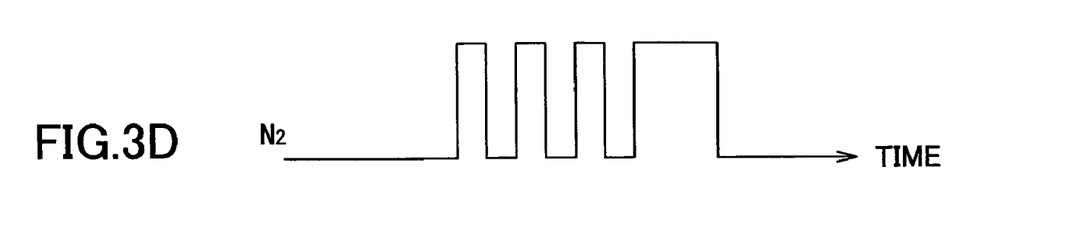
Figure 3E:
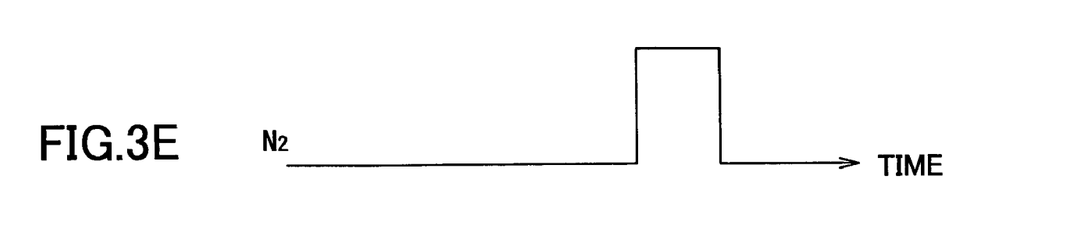

Further, as shown in FIG. 3D, it is possible to interrupt the supply of the nitrogen gas intermittently during the purging period to carry out a so-called cycle purge. By carrying out such a cycle purge process, it is possible to reduce the purging time further. Of course, it is possible to omit the purging process by the nitrogen gas in the event a sufficient time interval is allowed between the oxidation processing A and the nitridation processing B as shown in FIG. 3E.

Second Embodiment

Figure 4A:
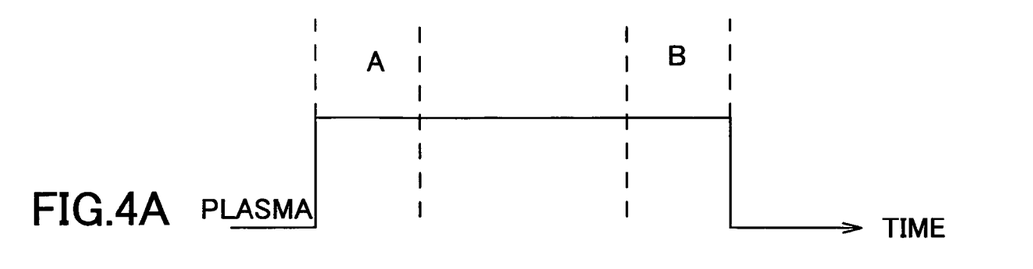
FIGS. 4A-4D are diagrams showing the substrate processing method according to a second embodiment of the present invention.

FIGS. 4A-4 shows the substrate processing method according to a second embodiment of the present invention that uses the substrate processing apparatus 10 of FIG. 1.

Figure 4B:
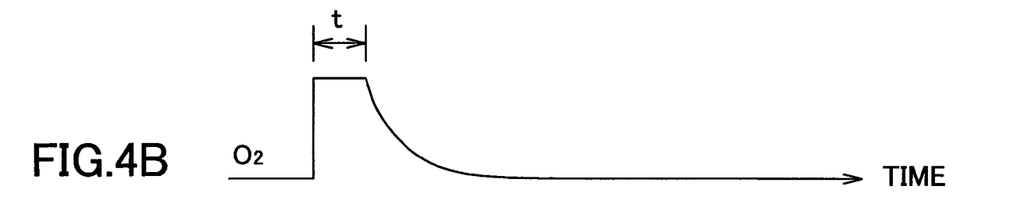

In the present embodiment, the plasma is formed continuously from the beginning of the oxidation processing process A to the end of the nitridation processing process B as shown in FIG. 4A. On the other hand, the present embodiment sets the supply time t of the oxygen gas to be shorter than the duration of the oxidation processing process as shown in FIG. 4B so as to avoid the increase of the film thickness of the oxide film in the nitridation processing B. With this, the supply of the oxygen gas is discontinued prior to the completion of the oxidation processing, and the remaining oxidation processing process is carried out by the residual oxygen remaining in the processing vessel 11 or gas supply system.

Figure 4C:
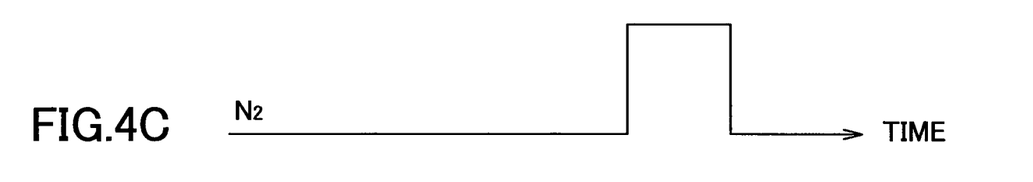

In the present embodiment, the oxidation processing is terminated at the time of introduction of the nitrogen gas shown in FIG. 4C, and thus, there occurs no problem of increase of oxide film thickness at the time of the nitridation processing.

In the present embodiment, the plasma is formed continuously from the beginning of the oxidation processing to the end of the nitridation processing, and thus, the residual oxygen is consumed for the oxidation processing after the supply of the oxygen gas is shut down in FIG. 4B. Thereby, the concentration of the residual oxygen falls off rapidly, and thus, it becomes possible to start the nitridation processing after the oxidation processing without providing long oxygen purging process. Thereby, the throughput of the substrate processing is improved.

Figure 4D:
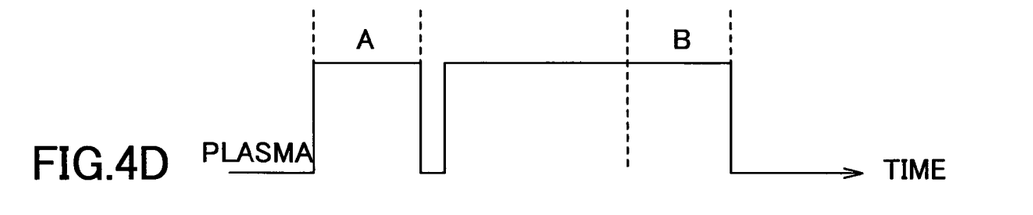

Further, as shown in FIG. 4D, it is possible to turn off the plasma immediately after the oxidation processing A and reignite Ar plasma alone. Thereby, the nitridation processing is conducted by later introducing the N$_2$ gas. This method uses also the same principle of the present embodiment.

Third Embodiment

Figure 5:
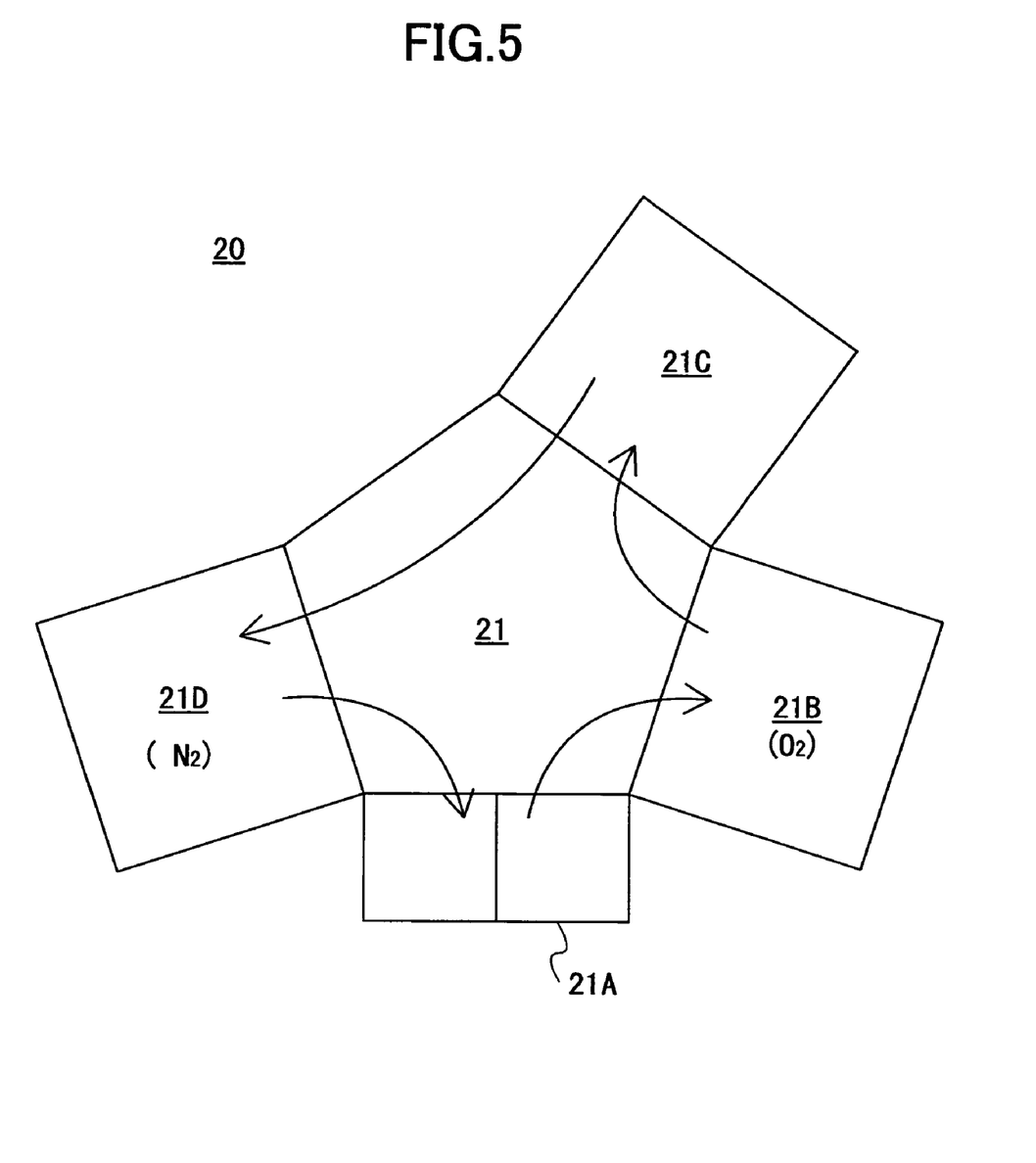
FIG. 5 is a diagram showing the substrate processing method that uses a cluster-type substrate processing apparatus according to a third embodiment of the present invention.

FIG. 5 shows the construction of a cluster-type substrate processing apparatus 20 according to a third embodiment of the present invention.

Referring to FIG. 5, the cluster-type substrate processing apparatus 20 has a vacuum transportation chamber 21 connected with a cassette module 21A, and substrate processing chambers 21B and 21D having a construction identical to that of the substrate processing apparatus 10 of FIG. 1 are coupled to the vacuum transportation chamber 21 together with the preprocessing chamber 21C. Thus, a silicon substrate loaded to the cassette module 21A is transported to the substrate processing chamber 21B by a transportation robot (not shown) in the vacuum transportation chamber 21, and plasma oxidation processing is carried out in the substrate processing chamber 21B. Thereby, an oxide film is formed on the silicon substrate surface.

The silicon substrate thus processed with the oxidation processing is transported to the preprocessing chamber 21C, wherein oxygen molecules absorbed to the substrate surface are removed by holding the substrate at the temperature of 300-600 °C. for several minutes in an Ar or nitrogen ambient.

The silicon substrate thus processed with the pre-processing is transported to the substrate processing chamber 21D through the vacuum transportation chamber 21 and the nitridation processing similar to the one explained previously is conducted. Thereby, it should be noted that there is caused no change of atmosphere in the substrate processing chamber 21D, and the nitridation processing is started immediately when the substrate is transported. Thereby, overall throughput of the substrate processing is improved. Further, the efficiency of oxygen removal is improved in the present embodiment, by removing the adsorbed oxygen molecules from the substrate to be processed in the dedicated preprocessing chamber 21C, and it becomes possible to suppress the increase of film thickness at the time of the nitridation processing effectively.

In FIG. 5, it is possible to reduce the duration of the substrate pre-processing in the preprocessing chamber 21C by conducting an Ar plasma processing. Further, such a preprocessing can be conducted also in the substrate processing chamber 21D.

Fourth Embodiment

Figure 6:
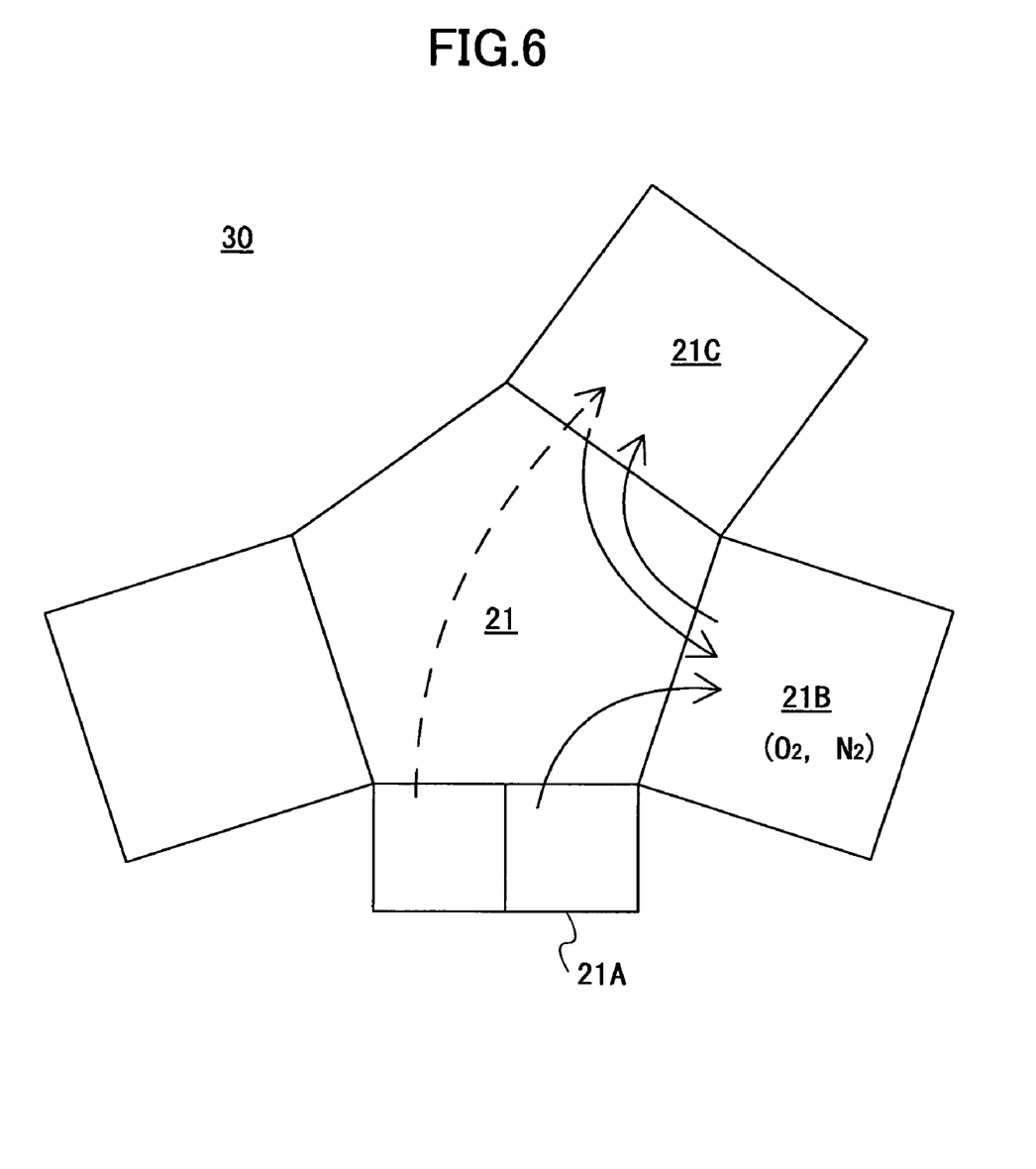
FIG. 6 is a diagram showing the substrate processing method that uses a cluster-type substrate processing apparatus according to a fourth embodiment of the present invention.

FIG. 6 shows the construction of a cluster-type substrate processing apparatus 30 according to a fourth embodiment of the present invention, wherein those parts of FIG. 6 explained previously are designated with the same reference numerals and the description thereof will be omitted.

Referring to FIG. 6, there is conducted plasma oxidation processing and plasma nitridation processing in the substrate processing chamber 21B in the substrate processing apparatus 30.

More specifically, a substrate to be processed is first supplied to the substrate processing chamber 21B through the vacuum transportation chamber 21 from the cassette module 21A, and the plasma oxidation processing explained previously is carried out. The substrate thus processed with the oxidation processing is transported to the preprocessing chamber 21C through the vacuum transportation chamber 21 and the adsorbed oxygen molecules are removed by the heat treatment or Ar plasma processing.

During the interval in which the substrate is processed with the preprocessing chamber 21C, the ambient is switched in the substrate processing chamber 21B from the oxygen ambient to the nitrogen ambient as explained previously with FIGS. 3A-3E and FIGS. 4A-4C. Further, it is possible to switch the ambient of the processing chamber 21B to the nitrogen ambient by introducing a dummy wafer into the processing chamber 21B during the interval in which the substrate is processed in the pre-processing chamber 21C and apply a plasma processing to the dummy wafer. Also, it is possible to conduct a similar processing without using a dummy wafer.

Thus, at the moment in which the substrate, finished with the pre-processing in the preprocessing chamber 21C, has returned to the processing chamber 21B through the vacuum transportation chamber 21, the ambient in the processing chamber 21B is already changed to the nitrogen atmosphere, and purge of the residual oxygen molecules is completed. Thus, by igniting the plasma in the processing chamber 21C, it becomes possible to nitride the oxide film that has been formed on the surface of the above-mentioned substrate surface.

Thus, the present embodiment can implement the removal of the oxygen molecules adsorbed to the substrate in a dedicated preprocessing chamber 21C, concurrently to the switching of the ambient in the substrate processing chamber 21B. Thereby, the throughput of the substrate processing is improved. Further, in the substrate processing apparatus 30 of the present embodiment, it is sufficient to provide only one such substrate processing apparatus 10 of FIG. 1. Thus, the manufacturing cost of the substrate processing apparatus 30 is reduced.

Furthermore, the construction of FIG. 6 is useful also in the case of nitriding a thermal oxide film formed in an external batch type oxidation processing apparatus by using the substrate processing apparatus 10 of the FIG. 1.

Thus, a silicon substrate subjected to an oxidation processing such as thermal oxidation processing in an external oxidation processing apparatus inevitably absorbs moisture in the atmosphere as it is transported through the atmosphere, and the nitridation processing conducted to such a silicon substrate thus absorbed the moisture by using the microwave plasma processing apparatus such as the one shown in FIG. 1 causes the problem, due to the fact that the moisture is not removed sufficiently because of the low substrate temperature of the nitriding processing, that there occurs oxidation in the substrate by the oxygen contained in the moisture.

Contrary to this, in the case of the substrate processing apparatus 30 of FIG. 6, the silicon substrate thus applied with the oxidation processing is transported directly from the cassette module 21A to the preprocessing chamber 21C as shown with the broken line in the drawing, and it becomes possible to remove the absorbed water molecules from the substrate surface by conducting, in the preprocessing chamber 21C, a heat treatment at the temperature of 300-600° C. in an Ar ambient or plasma processing.

By conveying the substrate thus conducted with the pre-processing to the substrate processing chamber 21B, it becomes possible to nitride an oxide film without causing increase in the film thickness by oxidation. In such a case, the substrate processing chamber 21B is dedicated to the nitridation processing, and there is no need of switching of the ambient. Accordingly, there is caused no oxidation by the residual oxygen in the substrate processing chamber 21B.

According to the needs, it is possible to integrate the function of the preprocessing chamber 21C with the substrate processing chamber 21B.

In this case, the substrate temperature control mechanism 12a in the stage 12 is driven in the substrate processing apparatus 10 of FIG. 1 provided in the substrate processing chamber 21B, and the substrate is heated to the desired temperature of 300-600° C. in an Ar ambient. Of course, it is possible to form plasma according to the needs.

While the present invention has been explained for the preferred embodiments heretofore, it should be noted that the present invention is not limited to those embodiments and the various variations and modifications can be possible within scope defined by the claims.

According to the present invention, increase of film thickness of the oxide film caused by oxygen remaining in the ambient is suppressed at the time of the nitridation processing of the oxide film formed to the silicon substrate surface, and it becomes possible to form a very thin oxynitride nitride film suitable for the gate insulation film of a ultra high-speed semiconductor device.

What is claimed is:

1. A substrate processing method, comprising the steps of:
    forming an oxide film by carrying out an oxidizing processing with a gas containing oxygen to a silicon substrate surface held in a first processing vessel;
    supplying a gas containing nitrogen into a second processing vessel;
    forming plasma of the gas containing nitrogen over said silicon substrate in said second processing vessel by supplying microwave power into said second processing vessel;

forming an oxynitride film by carrying out a vacuum nitriding processing to said oxide film with said plasma at a temperature of 600° C. or less in said second processing vessel, wherein purging of oxygen is carried out from said silicon substrate surface during an interval from an end of said oxidizing processing to a start of said nitriding processing so as to suppress increase of film thickness of said oxide film during said nitriding processing, and further wherein said purging of oxygen is carried out in a third processing apparatus.

2. The method as claimed in claim 1, wherein said first processing apparatus is a batch oxidation processing apparatus and wherein said second processing apparatus is a plasma processing apparatus.

3. A substrate processing method, comprising the steps of:

forming an oxide film by carrying out an oxidizing processing with a gas containing oxygen to a silicon substrate surface held in a first processing vessel;

transferring said silicon substrate surface from said first processing vessel to a second processing vessel;

supplying a gas containing nitrogen into said first processing vessel;

transferring said silicon substrate surface from said second processing vessel to said first processing vessel;

forming plasma of the gas containing nitrogen in said first processing vessel over said silicon substrate by supplying microwave power into said first processing vessel;

forming an oxynitride film by carrying out a vacuum nitriding processing to said oxide film with said plasma at a temperature of 600° C. or less in said first processing vessel, wherein purging of oxygen is carried out from said silicon substrate surface during an interval from an end of said oxidizing processing to a start of said nitriding processing so as to suppress increase of film thickness of said oxide film during said nitriding processing, wherein said purging of oxygen is carried out in said second processing apparatus.

4. The method as claimed in claim 1, wherein each of said second and third processing apparatuses carries out a thermal processing or a plasma processing.

5. The method as claimed in claim 1, wherein said oxidation processing and said nitridation processing are carried out by plasma processing.

* * * * *